United States Patent [19]

Blackburn et al.

[11] 4,012,688
[45] Mar. 15, 1977

[54] RESISTIVE PAD WITH BRIDGING RESISTOR

[75] Inventors: Tom L. Blackburn, San Jose; Otto G. Wisotzky, San Francisco, both of Calif.

[73] Assignee: GTE Automatic Electric Laboratories Incorporated, Northlake, Ill.

[22] Filed: Nov. 28, 1975

[21] Appl. No.: 636,185

[52] U.S. Cl. .................................. 323/79; 323/80; 323/81; 333/81 R
[51] Int. Cl.[2] ....................................... H02M 3/06
[58] Field of Search .................. 323/74, 79, 80, 81; 334/15; 333/81 R, 80 T; 174/1 N

[56] References Cited
UNITED STATES PATENTS

| | | | |
|---|---|---|---|
| 1,892,215 | 12/1932 | Mathiell | 333/81 |
| 2,811,695 | 10/1957 | Drexler | 333/81 |
| 3,541,430 | 11/1970 | Luger | 323/80 |
| 3,778,563 | 12/1973 | Bise et al. | 179/70 R |
| 3,796,945 | 3/1974 | Feldman et al. | 323/74 |
| 3,858,128 | 12/1974 | Mullin | 323/80 |
| 3,883,682 | 5/1975 | Cagle et al. | 174/68.5 |

*Primary Examiner*—Gerald Goldberg
*Attorney, Agent, or Firm*—Leonard R. Cool; Russell A. Cannon; David W. Heid

[57] ABSTRACT

Gain control circuits associated with the base and emitter electrodes of a common-emitter transistor amplifier stage include pluralities of electrically conductive screw-type switches and resistors. The net gains provided by the associated gain control circuits are cumulative and determine the net gain of the stage. The gain changes provided by individual switches of the base and emitter gain control circuits are also cumulative, the switches being selectively closed in a prescribed manner to provide step changes in the decibel value of the net gain of the stage in discrete steps of the same magnitude. A plurality of transistor amplifiers with associated emitter gain control circuits may be connected in series, with the decibel values of voltage gains thereof also being additive, to provide additional steps and range of voltage gain. Series resistors in the base gain control circuit are selectively short-circuited by screw switches to decrease the input resistance of the amplifier stage. A bridging resistor is selectively connected across certain of the series resistors by one of these screw switches for causing the associated step change in the input impedance of the stage to be more nearly equal to the desired value. Resistors in the emitter gain control circuit are electrically connected in parallel with the emitter resistor in the AC circuit equivalent of the amplifier in various configurations by screw switches to decrease the effective emitter resistance and thereby increase the decibel value of amplifier gain in steps of prescribed magnitude. The emitter gain control circuit may be AC coupled to the emitter resistor and the emitter electrode of the amplifier. Alternatively, one side of this gain circuit may be directly electrically connected to the emitter electrode. A resistive voltage divider network is then connected to the other end of this gain control circuit and across the positive and negative terminals of a source of bias voltage. The network resistors are selected to provide the same DC bias voltage on both sides of the emitter gain control circuit. This prevents DC current flowing through the emitter gain control circuit as the resistance thereof is changed and thereby maintains the DC bias level on the transistor constant. In this manner, the effective emitter resistance, and thus the amplifier gain, may be changed to any desired value without changing the operating point of the amplifier.

10 Claims, 13 Drawing Figures

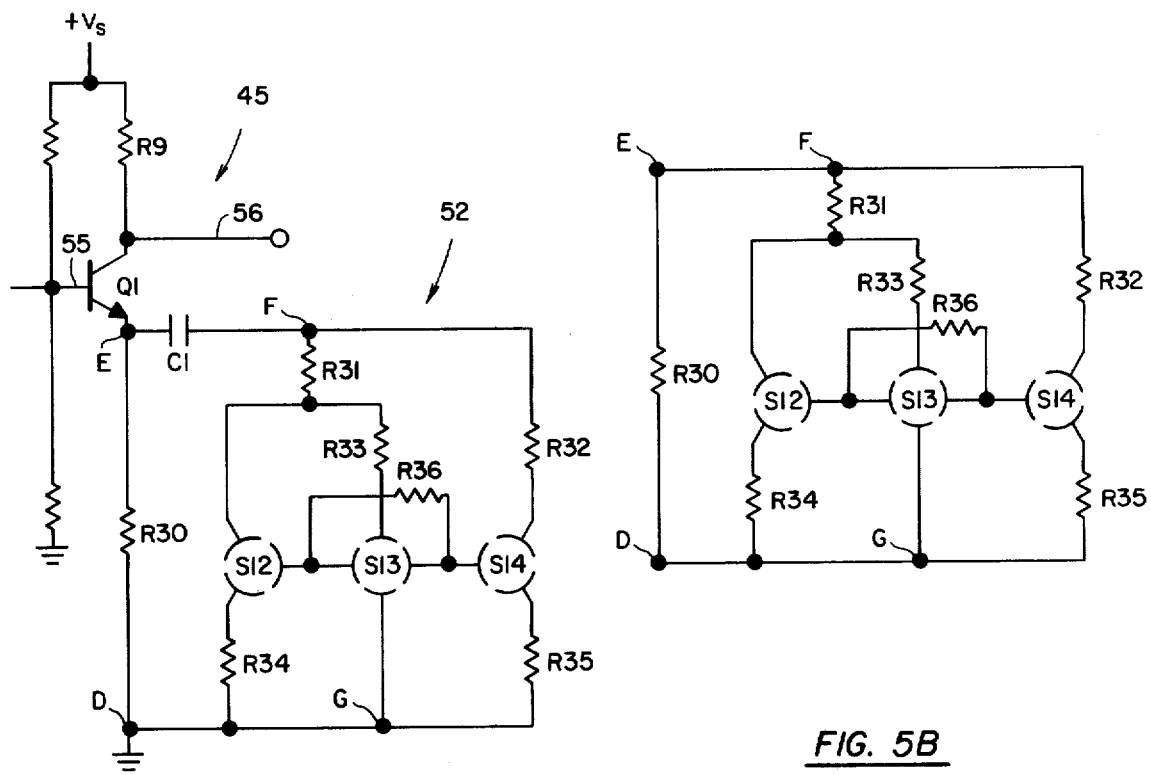
FIG. 5A
FIG. 5B
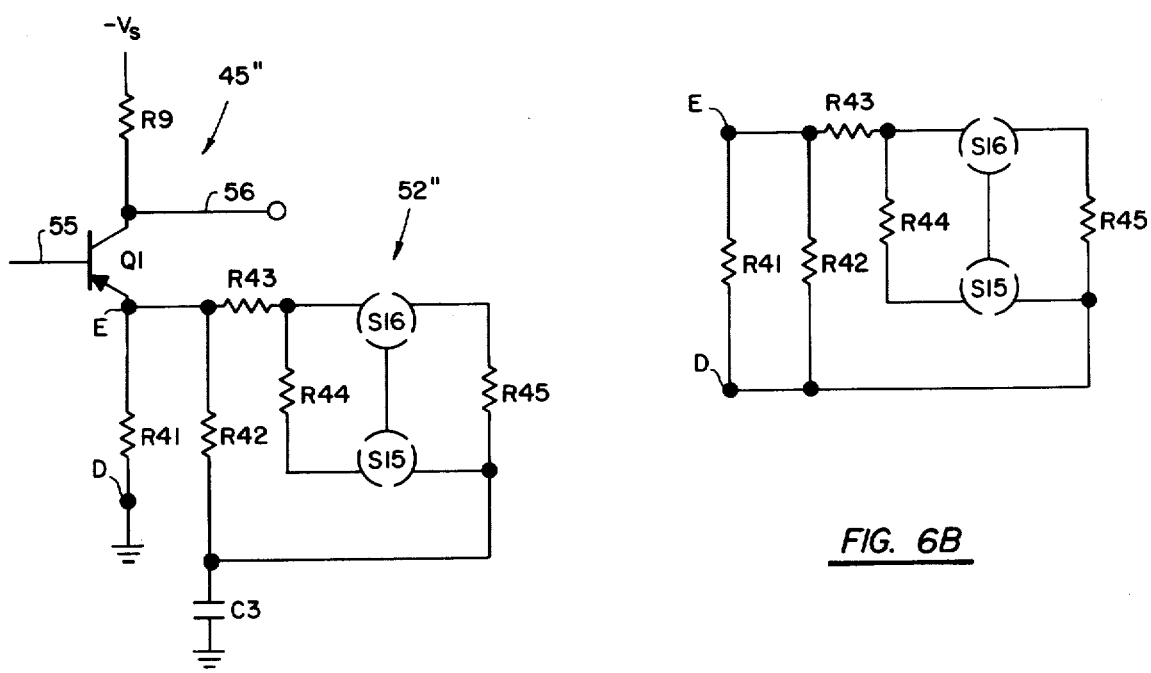
FIG. 6A
FIG. 6B

|  |  | 1 | 2 | 3 | 4 | 5 |
|---|---|---|---|---|---|---|
|  |  | SCREWS (IN) | $R_{DE}$ | dB | $G_v \approx R_L/R_{DE}$ | SOLVE FOR R ($\Omega$) |
| FIG. 1A-1B | 1 | NONE | R10 | 0 | 1.0 | R10 = 1.0 |
| | 2 | S6 | R10 // (R13+R17) | 2 | 1.26 | R13 = 2.85 |
| | 3 | S7 | R10 // (R12+R17) | 4 | 1.58 | R12 = 0.725 |
| | 4 | S6, S7 | R10 // R17 | 6 | 2.0 | R17 = 1.0 |
| FIG. 2A-2B | 5 | NONE | R10 | 9.1 | 2.86 | $R_{DE}$ = 1.62k |
| | 6 | S6' | R10 // (R13+R17) | 11.24 | 3.65 | $R_{DE}$ = 1.27k |
| | 7 | S7' | R10 // (R12+R17) | 13.56 | 4.76 | $R_{DE}$ = 0.994k |
| | 8 | S6', S7' | R10 // R17 | 15.56 | 6.0 | $R_{DE}$ = 0.775k |
| | 9 | ((R9 = 4.64k$\Omega$; R10 = 1.62k$\Omega$; R11 = 1.2k$\Omega$; R12 = 1083$\Omega$; R13 = 4383$\Omega$; R14 = 1609$\Omega$; R15 = 19.2k$\Omega$; R17 = 1484$\Omega$ )) | | | | |
| FIG. 3A-3B | 10 | NONE | R23 | 0 | 1.0 | R23 = 1.0 |
| | 11 | S8 | R23 // R20 | 1 | 1.12 | R20 = 8.34 |
| | 12 | S9 | R23 // R21 | 2 | 1.26 | R21 = 3.85 |
| | 13 | S8, S9 | R23 // R20 // R21 // R22 | 3 | 1.41 | R22 = 33.3 |
| FIG. 4A-4B | 14 | NONE | R24 | 0 | 1.0 | R24 = 1.0 |
| | 15 | S10 | R24 // R25 | 1 | 1.12 | R25 = 8.34 |
| | 16 | S11 | R24 // (R26+R27) | 2 | 1.26 | R26 + R27 = 3.85 |
| | 17 | S10, S11 | R24 // R25 // R26 | 3 | 1.41 | R26 = 3.45 |
| | | | | | | R27 = 0.4 |
| FIG. 5A-5B | 18 | NONE | R30 | 0 | 1.0 | R30 = 1.0 |
| | 19 | S12 | R30 // (R31+R34) | 1 | 1.12 | R34 = 5.89 |
| | 20 | S13 | R30 // (R31+R33) | 2 | 1.26 | R33 = 1.41 |
| | 21 | S12, S13 | R30 // R31 | 3 | 1.41 | R31 = 2.44 |
| | 22 | S14 | R30 // (R32+R35) | 4 | 1.58 | R35 = 0.0345 |
| | 23 | S12, S14 | R30 // ( ··· ) | 5 | 1.78 | R36 = 5.620 |
| | 24 | S12, S13, S14 | R30 // R31 // R32 | 6 | 2.0 | R32 = 1.69 |
| FIG. 6A-6B | 25 | NONE | R41 // R42 | 9.1 | 2.86 | $R_{DE}$ = 359 |
| | 26 | S15 | (R41 // R42) // (R43+R44) | 10.1 | 3.22 | $R_{DE}$ = 318 |
| | 27 | S16 | (R41 // R42) // (R43+R45) | 17.9 | 7.88 | $R_{DE}$ = 130 |
| | 28 | S15, S16 | R41 // R42 // R43 | 19.0 | 8.95 | $R_{DE}$ = 114.6 |
| | 29 | ((R9 = 1023$\Omega$; R41 = 511$\Omega$; R42 = 1210$\Omega$; R43 = 168$\Omega$; R44 = 2595$\Omega$; R45 = 36$\Omega$ )) | | | | |

*FIG. 7*

RESISTIVE PAD WITH BRIDGING RESISTOR

BACKGROUND OF INVENTION

This invention relates to transistor amplifier stages with gain control circuits, and more particularly to such circuits which cause the decibel value of the net gain of the stage to vary in discrete steps of substantially the same magnitude.

Line amplifiers in telecommunication systems typically have some form of manual gain adjustment for setting levels throughout a system. Gain changes are normally provided in discrete logarithmic (decibel) steps of the same value for convenience. The prior-art line amplifier disclosed in U.S. Pat. No. 3,778,563 uses a resistive L-pad on the input of a fixed gain amplifier. Each section of this L-pad comprises a series resistor between an input line and the input of the amplifier, and a shunt resistor connected to one end of an associated series resistor. A plurality of such sections may be connected in series without substantially changing the input impedance of the amplifier. The decibel values of attenuation per section of the pad therefore add up on a linear basis. The attenuation of the input pad is decreased (i.e., the net gain is increased) by removing sections therefrom. This is accomplished by closing one shunt screw switch to short-circuit the associated series resistor and at the same time opening a series screw switch to open-circuit the associated shunt resistor. Thus, it is seen that at least two screw adjustments are required there for each step change in attenuation or gain. Since the overall gain of this prior-art circuit is adjusted by removing resistive elements from the input circuit thereof, the amplifier following the pad is normally adjusted to have a relatively high gain. Such a high-gain amplifier is inherently more susceptible to noise, oscillation, and increased power drain than an amplifier normally operating at a lower level of gain.

An object of this invention is the provision of an improved resistive pad.

BRIEF DESCRIPTION OF DRAWINGS

FIGS. 5A and 5B are a schematic circuit diagram and the associated AC circuit equivalent of the emitter circuit of yet another alternate embodiment of the amplifier stage wherein the gain control circuit 52 includes three adjustment screws;

FIGS. 6A and 6B are a schematic circuit diagram and the associated AC circuit equivalent of the emitter circuit of another embodiment of the amplifier stage which was built and successfully operated in series with the circuit of FIG. 2A to provide a broader range and larger number of steps of gain adjustment than are provided by the circuit of FIG. 2A alone; and FIG. 7 is a tabulation disclosing and summarizing the structure and operation of the various embodiments of the amplifier stage which are illustrated in other figures here.

Figure 1A:
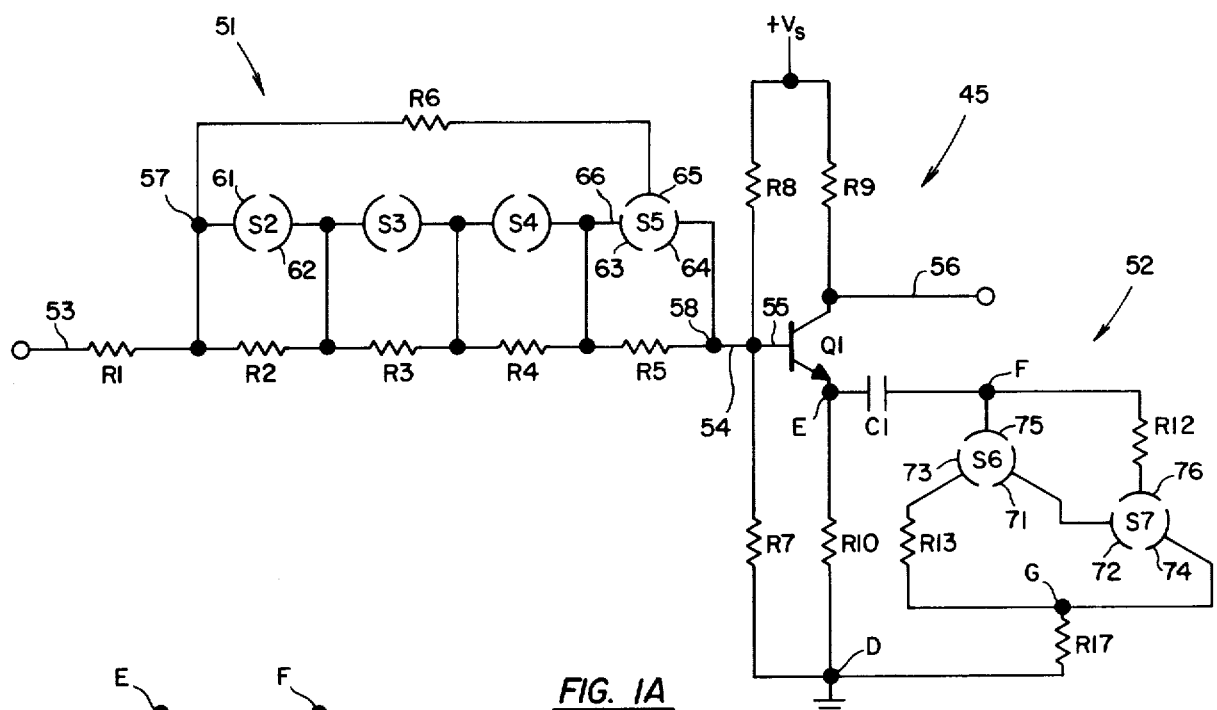
FIG. 1A is a schematic circuit diagram of an amplifier stage embodying this invention and including a pair of gain control circuits 51 and 52 which are associated with transistor Q1.

The same and primed reference characters designate similar elements in the figures. Different reference characters are used to designate other elements such as the emitter resistors R10, R10', R23, etc., however, to make certain and definite which ones of the corresponding elements are designated thereby.

DESCRIPTION OF PREFERRED EMBODIMENTS

Referring now to the preferred embodiment of this invention in FIG. 1A, the amplifier stage there comprises a transistor Q1 having gain control circuits 51 and 52 associated with the base and emitter electrodes, respectively, of the transistor for adjusting the net gain of the stage. The circuit is preferably fabricated on a printed circuit board, although it also may be formed on a ceramic substrate or by other appropriate techniques. An input signal on line 53 is coupled through the gain control circuit 51 to lines 54 and 55 and the base electrode of the transistor Q1. An amplified output signal is coupled on line 56 from the collector electrode of Q1. The Q1 base and collector electrodes are connected to the positive terminal $+V_s$ of a source of supply voltage through bias resistor R8 and load resistor R9, respectively, whereas the ground terminal of the voltage source is connected through bias resistor R7 and emitter resistor R10 to the base and emitter electrodes, respectively, of the transistor.

The gain control circuit 51 is essentially an L-pad comprising the bias resistor R7 which forms one leg of the L-pad; a plurality of resistors R1 – R5 that are connected in series between the input line 53 and the Q1 base electrode and which form the other leg of the L-pad; a plurality of screw-type switches S2 – S5 which are connected across associated resistors R2 – R5, respectively; and a bridging resistor R6 which is connected between switch S5 and the node 57 between resistors R1 and R2. The switches S are preferably similar to those illustrated in U.S. Pat. No. 3,883,682.

Each of the switches S comprises an aperture in a printed circuit board; a plurality of spaced-apart electrically conductive arcuate contacts adjacent to and spaced from the circumference of the aperture; and an electrically conductive flathead screw (not shown). The switch S2, for example, has a pair of electrical contacts 61 and 62 which have a semicircular shape whereas switch S5 has three electrical contacts 63 – 65. Reference being had to switch S2, the shank of a screw is threaded into the aperture associated with this switch. The diameter of the head of the screw is sufficiently large to completely overlap both of the contacts 61 and 62. When switch S2 is in the open position, the screw is threaded out of the aperture sufficiently far that the head thereof is spaced from and does not make electrical contact with contacts 61 and 62. Switch S2 is closed by inserting the screw fully into the aperture until the underside of the head thereof physically touches both of the contacts 61 and 62 so as to bridge the gap between these spaced-apart contacts and establish electrical continuity therebetween. Although switches such as S2 and S5 are shown in FIG. 1A having two and three contacts, respectively, screw switches having more than three contacts may be employed in alternate embodiments of the amplifier stage. The preferred embodiment of the switch means here is an electrically conductive screw and associated spaced-apart conductors. The switch means S2, S3, etc., may also be straps, shorting plugs, rotary switches having wiper arms contacting a plurality of switch contacts, or other devices satisfying the same functions.

The L-pad of circuit 51 is essentially an attenuator which increases or decreases the level of an input signal on line 53 by selectively reducing or raising the value of net resistance between lines 53 and 54. This circuit 51 is employed here to produce small changes in the net gain of the amplifier stage. When all of the switches S2 – S5 are open, the series resistance of circuit 51 is the sum of the resistances of R1 – R5, and this circuit has a reference gain, for example, of 0 dB. The gain of circuit 51 is increased one step by closing screw switch S2 to short-circuit R2 and reduce the series resistance in lines 53 – 54. The circuit 51 gain is increased another step by closing only switch S3 to remove R3 from the circuit and further reduce the series resistance of the L-pad. The decibel values of the changes in gain produced by these switches are cumulative. Thus, when both S2 and S3 are closed, the gain of circuit 51 is the sum of the gains produced by closing the individual switches S2 and S3.

Although the input impedance of amplifier 45 does not remain perfectly constant when the series resistance of circuit 51 is varied, any error can be ignored for small changes in net gain. When the net gain change approaches 1 dB, however, (e.g., when S5 is closed to remove R5 from the circuit) the error is approximately 0.1 dB. This error is compensated for in the circuit 51 in FIG. 1A by adding the third contact 65 to S5 and connecting a resistor R6 between this switch S5 and node 57 such that R6 bridges the series combination of resistors R2, R3, and R4. This causes the net series resistance and the gain change provided by closing S5 to be more nearly equal to the desired value. This same correction technique may be applied to other switches where it is deemed warranted.

In an embodiment of the amplifier stage that was built and successfully operated, the decibel value of voltage gain of the circuit 51 was increased in equal steps of 0.1 dB from 0 dB to 1.5 dB by selectively reducing the series impedance in the base circuit of Q1. The operation of circuit 51 is summarized by listing the relative voltage gains of this circuit and the corresponding ones of the switches S2 – S5 that are closed to provide such a gain, as follows: 0 dB with all switches open (no switches closed); 0.1 dB for S2 closed; 0.2 dB for S3; 0.3 dB for S2 and S3; 0.4 dB for S4; 0.5 dB for S2 and S4; 0.6 dB for S3 and S4; 0.7 dB for S2, S3, and S4; 0.8 dB for S5; 0.9 dB for S2 and S5; etc. The resistances of resistors in the circuit 51 that was operated were: R1 = 21.35 kilohms, R2 = 450 ohms; R3 = 1050 ohms; R4 = 1900 ohms; R5 = 3400 ohms; R6 = 31.6 kilohms, and R7 = 46.3 kilohms. The contact 65 of switch S5 (with S2, S3, and S4 open) and resistor R6 change the series resistance between nodes 57 and 58 from 3.4 kilohms to 3.07 kilohms.

The gain of amplifier 45 (not including circuit 51) is proportional to the ratio of the load resistance and the emitter resistance for transistors having high $\beta$. The error in this gain approximation is only about 0.1 dB for a transistor with a $\beta$ of 50 and increases for lower values of $\beta$. If an open circuit is inserted between the nodes E and F in FIG. 1A, the amplifier gain is proportional to the ratio of the resistances of R9 and R10. The effective emitter resistance Q1, and thus the amplifier gain, may be changed by connecting various combinations of resistors in shunt with emitter resistor R10. The gain control circuit 52 in FIG. 1A employs a pair of screw switches S6 and S7 for ajdusting the gain of amplifier 45 in discrete steps having the same decibel value. This circuit 52 is employed to produce large changes in the net gain of the amplifier stage, gain changes produced by individual switches S6 and S7 being cumulative.

Figure 1B:
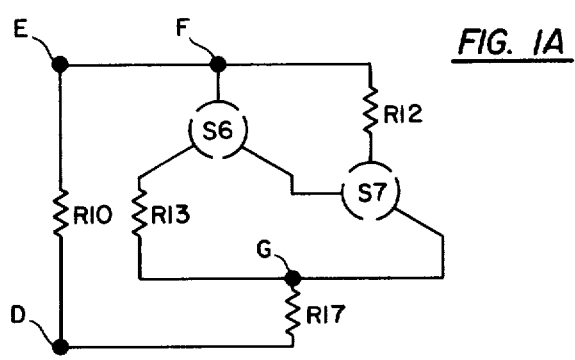
FIG. 1B is a schematic circuit representation of the AC circuit equivalent of the emitter circuit in FIG. 1A including the gain control circuit 52 which controls the effective emitter resistance of transistor Q1 and the gain of amplifier 45.

The gain control circuit 52 in FIGS. 1A and 1B comprises the pair of screw switches S6 and S7 and a pair of resistors R12 and R13 which are electrically connected together in a prescribed manner between nodes F and G. The switch contacts 71 and 72 are directly electrically connected together. The contact 73 of S6 is connected through R13 to node G whereas the contact 74 of S7 is directly electrically connected thereto. Conversely, the contact 75 of S6 is directly electrically connected to node F, whereas the contact 76 of S7 is electrically connected thereto through resistor R12. Node F is AC coupled to node E and one side of emitter resistor R10 through DC blocking capacitor C1. Node G is coupled through resistor R17 to node D and the other side of emitter resistor R10, which is also connected to the ground reference potential. The AC circuit equivalent of the emitter circuit of FIG. 1A is shown in FIG. 1B.

The AC operation of amplifier 45 and gain control circuit 52 is summarized in rows 1 – 4 of the tabulation in FIG. 7. Column 1 indicates the status of the screw switches S6 and S7, i.e., whether a switch is closed; column 2 indicates the effective emitter resistance $R_{DE}$ (between nodes D and E) which is produced by the switches; columns 3 and 4 indicate corresponding decibel values (20 log$_{10}$ G$_r$) of voltage gain and voltage ratios $G_r = R_L R_{DE}$ of the amplifier, respectively; and column 5 lists normalized values of resistances of resistors where $R_L$ R10 = 1 ohm.

Briefly, when S6 and S7 are both open (FIG. 7, row 1), the 0 dB reference gain of amplifier 45 is determined by an effective emitter resistance $R_{DE}$ which is equal to the resistance of R10. The 0 dB reference gain is increased 2 dB by closing only S6 (FIG. 7, row 2). This gain change is accomplished by connecting the series combination of resistors R13 and R17 in parallel with R10 to decrease the effective emitter resistance $R_{DE}$. The decibel value of voltage gain is increased another 2 dB by opening S6 and closing S7 (FIG. 7, row 3) to connect the series combination of resistors R12 and R17 in parallel with R10 to further decrease the value of the effective emitter resistance $R_{DE}$. Finally, the decibel value of voltage gain of amplifier 45 is again increased by the same amount to 6 dB by closing both of the switches S6 and S7 to short-circuit resistors R12 and R13 and connect R17 in parallel with emitter resistor R10 (FIG. 7, row 4). Normalized resistance values of the resistors are shown in column 5. Actual values of resistances for these resistors may be computed as is well known in the art, e.g., by selecting values of $R_L$ and/or R10 and multiplying other resistances by corresponding factors. Although 2 dB step changes in gain are indicated for the circuit 52 in FIG. 1A, other values of gain change may be obtained by selecting the resistance of one resistor and scaling the resistances of the other resistors. A reference gain of other than 0 dB, e.g., to compensate for losses in the input circuit, may be obtained by making the resistance ratio $R_L/R_{DE}$ other than unity.

The emitter circuit in FIG. 1A includes a DC blocking capacitor C1 between nodes E and F. The DC bias current through R10 sets the operating point of the amplifier. The effective AC emitter resistance in FIG. 1B determines the gain of the amplifier. In an alternate form of the structure coupling the circuit 52 to the emitter resistor R10, the capacitor C1 is replaced by a short circuit between nodes E and F, and node G is also connected through a bias resistor (not shown) to a source of positive supply potential. In this alternate circuit, the bias resistor corresponding to R17 between ground and node G, and the bias resistor between node G and the supply voltage are selected to provide the same DC bias voltages at nodes E and G. Since these nodes E and G are at the same DC potential, DC current will not flow through circuit 52. The same DC bias current as before will flow through R10 to set the operating point of amplifier 45, however, even when values of resistance in circuit 52 are changed. This means that the operating point of Q1 will be unaffected by resistance changes in circuit 52 so as to prevent a shift in the output level of the amplifier. It is the effective AC emitter resistance that changes and determines the gain of amplifier 45. The AC equivalent of this alternate structure is the same as that shown in FIG. 1B where the resistance of the parallel combination of the two DC bias resistors that are electrically connected between ground and node G, and between node G and the source of bias voltage, is equal to the resistance of R17.

Figure 2B:
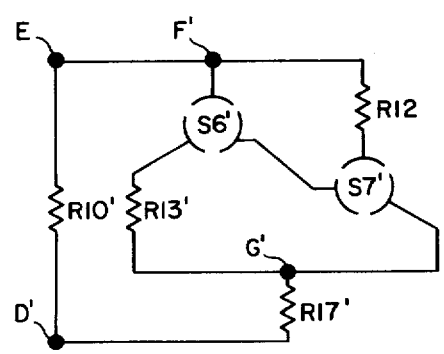
FIG. 2B is a schematic representation of the AC circuit equivalent of the emitter circuit in FIG. 2A and is the same as that shown in FIG. 1B for the amplifier stage illustrated in FIG. 1A.
Figure 2A:
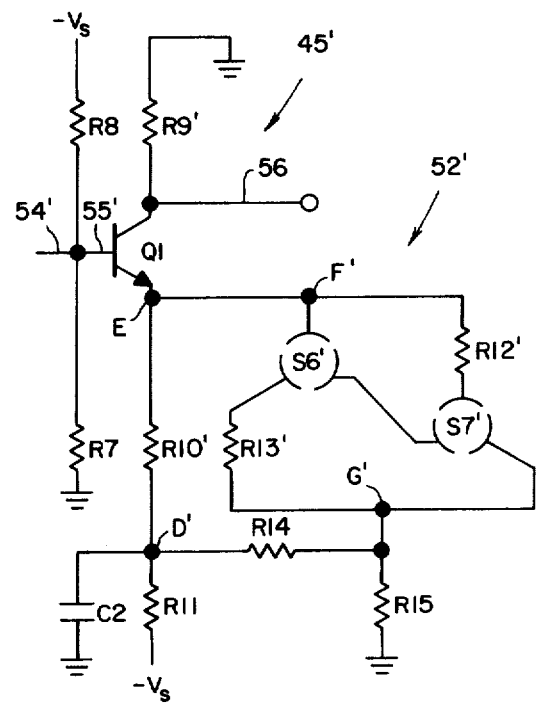
FIG. 2A is a schematic circuit diagram of an alternate embodiment of the amplifier stage which was built and tested, the gain control circuit 52' here being DC coupled to the emitter of transistor Q1.

An alternate embodiment of the amplifier stage which was built and successfully operated is illustrated in FIG. 2A. The circuits in FIGS. 1A and 2A are similar, principal differences being that the DC blocking capacitor C1 is omitted in FIG. 2A, that the load resistor R9' is connected to ground, and that the emitter resistor R10' is connected through a DC bias resistor R11 to a source of negative supply voltage $-V_s$. An AC bypass capacitor C2 is connected between node D' and ground to effectively remove resistor R11 from the AC equivalent circuit in FIG. 2B. A first bias resistor R14 is connected between the node G' and the DC reference voltage at node D' in FIG. 2A. A second DC bias resistor R15 is connected between node G' and ground. The resistors R14 and R15 cause the DC bias voltages at nodes E and G' to be the same value. As was stated above, this prevents changes in the resistance of circuit 52', changing the DC bias level of amplifier 45' and accomplishes the same purpose as the AC coupling capacitor C1 in FIG. 1A. The AC circuit equivalent of the emitter circuit in FIG. 2A is illustrated in FIG. 2B. Reference to FIGS. 1B and 2B reveals that the emitter circuits in FIGS. 1A and 2A have the same AC equivalent circuits wherein the resistor R17' has a resistance equal to that of the parallel combination of resistors R14 and R15.

The operation of amplifier 45' in FIGS. 2A and 2B is summarized in rows 5 – 9 of FIG. 7. In this example, the quantities listed in columns 3, 4, and 5 of rows 5 – 8 represent actual values provided by the circuit which was built and successfully operated (where the resistors had resistance values listed in row 9). In this embodiment of the amplifier stage in FIG. 2A, the reference gain is 9.1 dB instead of 0 dB in order to compensate for loss in circuits preceding transistor Q1. Each step change in voltage gain in column 3, lines 5 – 8, is approximately 2 dB.

In an alternate embodiment of the circuit in FIG. 2A, the resistor R10' is connected directly to the negative supply voltage $-V_s$, and the resistor R14 is connected directly to a bias voltage source instead of to the node D'. In another alternate embodiment of the circuit of FIG. 2A, an AC coupling capacitor is connected in the line between nodes E and F'; the resistor R14 is connected in parallel with R15 instead of to the node D'; and capacitor C2 and R11 may be omitted such that the resistor R10' and node D' are directly connected to the negative supply voltage $-V_s$. The AC circuit equivalents of both of these alternate embodiments of the circuit in FIG. 2A are the same as that shown in FIG. 2B.

Figure 3A:
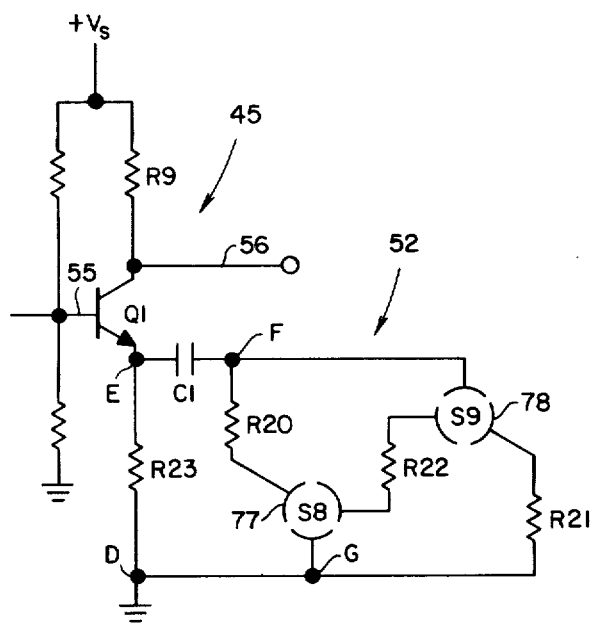
FIGS. 3A and 3B are a schematic circuit diagram and the associated AC circuit equivalent of the emitter circuit of another alternate embodiment of the amplifier stage wherein the gain control circuit 52 also includes a pair of adjustment screws.
Figure 3B:
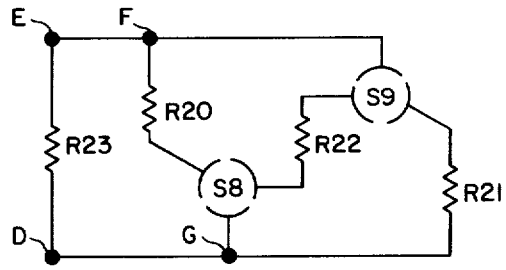

Another embodiment of the amplifier stage employing a pair of screw switches and the AC circuit equivalent of the emitter circuit thereof are illustrated in FIGS. 3A and 3B, respectively. The operation of switches S8 and S9 in controlling the gain of amplifier 45 is summarized in lines 10 – 13 in FIG. 7 for incremental changes in gain of 1 dB. In the alternate embodiment of the amplifier stage in FIG. 3A where coupling capacitor C1 is replaced with a short circuit, the line between nodes D and G is replaced with an open circuit and the node G is connected through associated bias resistors to the positive supply voltage $+V_s$ and ground. An AC bypass capacitor similar to the capacitor C2 in FIG. 2A may be connected between the node G and ground for effectively bypassing these bias resistors such that the AC circuit equivalent of the emitter circuit for this alternate embodiment of the amplifier stage is the same as that in FIG. 3B. If this AC bypass capacitor is omitted, the AC equivalent circuit there includes a resistor between nodes D and G in FIG. 3B in place of the short circuit that is shown there. The resistances of the various resistors may then be computed by trial and error or with the aid of a computer.

Another alternate embodiment of the amplifier stage is similar to the circuit of FIG. 3A, except that the resistor R22 is electrically connected between the contacts 77 and 78 of associated switches S8 and S9 such that the emitter resistor R23 is normally electrically connected in parallel with the series combination of resistors R20, R21, and R22 when S8 and S9 are open. The expressions for the effective emitter resistance $R_{DE}$ in this example are more complex than those shown in FIG. 7, lines 10 – 13, for the circuit of FIG. 3A and require more complex analysis techniques to identify particular values of the resistors.

Figure 4A:
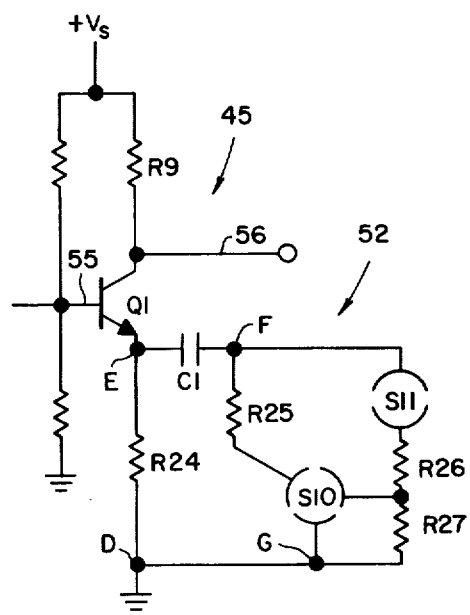
FIGS. 4A and 4B are a schematic circuit diagram and the associated AC circuit equivalent of the emitter of a further alternate embodiment of the amplifier stage wherein the gain control circuit 52 here also includes a pair of adjustment screws.
Figure 4B:
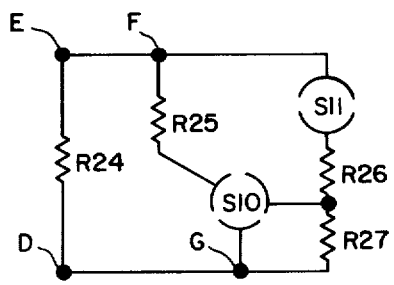

A further alternate embodiment of the amplifier stage employing only two screw switch means and the AC circuit equivalent of the emitter circuit thereof are illustrated in FIGS. 4A and 4B, respectively. The operation of this circuit is summarized in lines 14 – 17 in FIG. 7. This embodiment of the amplifier stage may also be modified to eliminate the coupling capacitor C1 between nodes E and F in the manner described above.

The embodiments of the amplifier stages in FIGS. 1A, 2A, 3A, and 4A employ only two screw switches to provide four different levels of voltage gain that are spaced apart by equal amounts. The number of different levels of voltage gain and the range of adjustment provided by the circuit may also be increased by increasing the number of screw switches in the gain control circuit 52. An embodiment of the amplifier stage employing three screw switches in the emitter circuit of amplifier 45 and providing six different levels of voltage gain that are spaced apart by the same amount, and the AC circuit equivalent of this emitter circuit are illustrated in FIGS. 5A and 5B, respectively. The operation of this circuit is summarized in lines 18 – 24 in FIG. 7. The normalized value of the resistance of R36 is computed by transforming back-to-back delta resistive networks (which occur when switches S12 and S14 are closed) into a pair of Y-networks which are then solved for R36. Although circuits employing more than three switches may be designed for providing amplifiers with greater numbers of different levels of equally spaced-apart voltage gain, the solution of such circuits becomes increasingly more difficult.

Although the step changes in gain in individual circuits in FIGS. 1A, 2A, 3A, 4A, and 5A are of the same value, and the gain changes provided by individual screw switches are all cumulative, the elements of gain control circuits 52 may be selected and arranged to provide step changes in gain which are not equal. By way of example, the resistors and switches in FIG. 6A are connected such that switches S15 and S16 provide gain changes of 1 and 8 dB, respectively (see rows 25 – 29 in FIG. 7).

The number of different levels of voltage gain and the range of adjustment provided by a circuit embodying this invention may also be increased by cascading the input gain circuit 51 and the amplifier 45 with associated circuit 52, and by cascading amplifiers 45 including associated gain control circuits 52. A relatively simple amplifier circuit providing 15 different levels of voltage gain that are spaced apart by the same amount was obtained in an embodiment of the amplifier stage that was built and successfully operated by cascading the amplifier circuits 45' in FIG. 2A and 45'' in FIG. 6A. In the resultant circuit, line 56 in FIG. 2A is essentially connected to line 55 in FIG. 6A. In this circuit, the decibel value of the net voltage gain is variable from 0 to 15 dB in increments of 1 dB for selected combinations of the switches S6', S7', S15, and S16. This operation may be briefly summarized by listing particular ones of the switches in FIGS. 2A and 6A which are closed to provide particular decibel values of voltage gain (where S6' = 2 dB, S7' = 4 dB, S15 = 1 dB, S16 = 8 dB), as follows: 0 dB for no switches closed; 1 dB for S15 closed; 2 dB for S6'; 3 dB for S6' and S15; 4 dB for S7'; 5 dB for S7' and S15; 6 dB for S6' and S7'; 7 dB for S6', S7', and S15; 8 dB for S16; 9 dB for S15 and S16; 10 dB for S6' and S16; 11 dB for S6', S15, and S16; 12 dB for S7' and S16; 13 dB for S7', S15, and S16; 14 dB for S6', S7', and S16; and 15 dB for S6', S7', S15, and S16 being closed. The number of different equally spaced-apart levels of net voltage gain was further increased and the magnitude of the changes in gain decreased by operating these two amplifiers with the gain control circuit 51 in FIG. 1A. The resultant amplifier stage provided relative changes in gain from 0 dB to 16.5 dB in 0.1 dB steps.

Although this invention is described in relation to specific preferred embodiments thereof, modifications and alternate designs will occur to those skilled in the art. By way of example, a particular one of the resistors in a gain control circuit may have a negative resistance. In FIG. 1A, the bridging resistor R6 in pad 51 may be connected to another switch means, e.g., S3, or be in the line 66. Further, a switch means may be connected across several series resistors and the same series resistor may be one of groups thereof associated with different switch means. Also, the resistances of the resistors in FIG. 3A, for example, may be selected to provide incremental step changes in voltage gain which are of a magnitude other than 1 dB. Although the values of voltage gain in the drawings are shown as providing increases in amplifier gain by connecting resistors in parallel with emitter resistor R10, the gain of the amplifier may also be adjusted by removing resistance from the emitter circuit to increase the effective emitter resistance and to decrease the gain of the circuit. The amplifier gain may also be adjusted by connecting a gain control circuit 52 to any resistive element such as the base or load resistor that controls the gain of the associated transistor. The resistors of the emitter gain control circuit may also be selectively interconnected through multicontact rotary switches (not shown), having certain contacts thereof connected to the resistors and other contacts thereof open circuited. Although a common emitter transistor amplifier is shown in the figures here, a common base or common collector configuration or operational amplifier circuit may be employed. Also, the gain control circuit 52 may be located in the base circuit of a transistor. The scope of this invention is therefore determined from the attached claims rather than the above detailed description of embodiments thereof.

What is claimed is:

1. A resistive pad having an attenuation between an input and an output terminal, measured with respect to a reference point, that is variable in discrete steps and having a net resistance between the input and output terminals, comprising:

a plurality of resistors electrically connected in series between the input and output terminals;

a shunt resistor electrically connected between a series resistor and the reference point;

a plurality of switch means, each of which is electrically connected across an associated series resistor; each of said switch means being in one of two states, the state of a switch means being changed to selectively control whether an associated series resistor is short-circuited for varying the net series resistance and attenuation of the pad; and a bridging resistor electrically connected between one of said switch means and one terminal of one series resistor, said one terminal being spaced from said one switch means, said bridging resistor being bridged across series resistors including at least said one series resistor when said one switch means is closed to short-circuit the associated series resistor for furter adjusting the value of the net resistance of the pad.

2. The pad according to claim 1 wherein said series resistors and bridging resistor have particular values of resistance and are associated with particular switch means for causing changes in the attenuation produced by changing the state of individual switch means to be cumulative.

3. The pad according to claim 2 wherein said series resistors have resistances for varying the attenuation in discrete steps having the same decibel value as selected ones of said plurality of switch means are changed from one state to another state in a prescribed manner.

4. The pad according to claim 1 wherein a switch means is closed to short-circuit an associated series resistor to reduce the net resistance of the pad.

5. A resistive pad having an attenuation between an input and an output terminal, measured with respect to a reference point, that is variable in discrete steps and having a net resistance between the input and output terminals, comprising:
   a plurality of resistors electrically connected in series between the input and output terminals;
   a shunt resistor electrically connected between a series resistor and the reference point;
   a plurality of switch means each being in one of two states;
   a bridging resistor;
   first means electrically connecting each of said switch means across an associated group of series resistors which includes at least one each series resistor; each group containing different combinations of series resistors; the state of a switch means being changed to vary the net resistance of the pad; and
   second connecting means electrically connecting said bridging resistor between one of said switch means and a terminal of one series resistor that is different from series resistors of said group thereof associated with said one switching means, said one series resistor terminal being spaced from series resistors of said group thereof associated with said one switch means; said bridging resistor being bridged across a group of series resistors including at least said one series resistor when said one switch means is closed for adjusting the value of the attenuation of the pad when said one switch means is closed.

6. The pad according to claim 5 wherein a switch means is closed to short-circuit an associated series resistor to reduce the net resistance of the pad.

7. A resistive pad having an attenuation between an input terminal and an output terminal, measured with respect to a reference point, that is variable in discrete steps and having a net resistance between the input and output terminals, comprising:
   a plurality of resistors electrically connected in series between the input and output terminals;
   a shunt resistor electrically connected between a series resistor and the reference point;
   a plurality of switch means, each being in one of two states;
   a bridging resistor; and
   means electrically connecting each of said switch means across an associated group of series resistors which includes at least one each series resistor; each group of series resistors containing different combinations of series resistors; said connecting means electrically connecting one of said switch means to the associated group of series resistors through said bridging resistor; the state of a switch means being changed to vary the net resistance of the pad.

8. The pad according to claim 7 wherein a switch means is closed to short-circuit an associated series resistor to reduce the net resistance of the pad.

9. A resistive pad having an attenuation between an input terminal and an output terminal, measured with respect to a reference point, that is variable in discrete steps and having a net resistance between the input and output terminals, comprising:
   a plurality of resistors electrically connected in series between the input and output terminals;
   a shunt resistor electrically connected between a series resistor and the reference point;
   a plurality of switch means, each being in one of two states;
   a bridging resistor; and
   means electrically connecting each of said switch means across an associated group of series resistors which includes at least one each series resistor; each group of series resistors containing different combinations of series resistors; said connecting means electrically connecting one of said switch means to another one of said switch means through said bridging resistor wherein the groups of series resistors associated with said one and said another switch means include other series resistors therebetween, the state of a switch means being changed to vary the net resistance of the pad.

10. The pad according to claim 9 wherein a switch means is closed to short-circuit an associated series resistor to reduce the net resistance of the pad.

* * * * *